United States Patent [19]

Deane

[11] Patent Number: 4,874,967

[45] Date of Patent: Oct. 17, 1989

[54] LOW POWER VOLTAGE CLAMP CIRCUIT

[75] Inventor: Peter Deane, Sunnyvale, Calif.

[73] Assignee: Xicor, Inc., Milpitas, Calif.

[21] Appl. No.: 133,125

[22] Filed: Dec. 15, 1987

[51] Int. Cl.$^4$ .............................................. H03K 3/01
[52] U.S. Cl. ................................ 307/296.8; 307/296.3
[58] Field of Search ...................... 307/296.8, 571, 572, 307/296.3; 365/103, 104, 226

[56] References Cited

U.S. PATENT DOCUMENTS

| | | | |
|---|---|---|---|
| 4,027,177 | 5/1977 | Davis | 307/297 |
| 4,042,843 | 8/1977 | Sikes | 307/297 |
| 4,438,346 | 3/1984 | Chuang et al. | 307/297 |

Primary Examiner—Stanley D. Miller
Assistant Examiner—Richard Roseen
Attorney, Agent, or Firm—McCubbrey, Bartels Meyer & Ward

[57] ABSTRACT

The voltage clamp circuit can clamp positive and/or negative voltages. The voltage clamp circuit includes voltage sensing and clamping circuit consisting of a chain of series connected diodes connected between an output and a reference terminal of the voltage clamp circuit. A current mirror circuit is connected to the chain of series connected diodes. A current generating circuit is connected to the current mirror circuit and sensing and clamping circuit. The voltage clamp circuit consumes only enough current to develop a threshold voltage across each of the chain of series connected diodes.

33 Claims, 3 Drawing Sheets

LOW POWER VOLTAGE CLAMP CIRCUIT

FIELD OF THE INVENTION

This invention relates to the field of integrated circuit voltage clamps and more specifically to a voltage clamping circuit which is adapted for use with CMOS electrically erasable read-only memory (EEPROM) devices.

BACKGROUND OF THE INVENTION

EEPROM devices are well known memory devices which are used for non-volatile storage of data. CMOS EEPROM devices are particularly adapted for use where power consumption is critical. For example, in battery powered applications, as the power consumption of a device decreases, its usefulness increases.

During operation, EEPROM devices generate a plurality of signals having a variety of voltage levels. One type of EEPROM device, referred to as a "thick-oxide" EEPROM incorporates a three layer polysilicon structure as the individual bit memory element. The three layers of polysilicon are separated from each other by a layer of oxide so that the second layer is electrically insulated from the other two. Data is retained on the second layer, which is sometimes referred to as the "floating gate." Data is stored on the floating gate by placing a high programming voltage (in the range of 25 volts) on a programming electrode so that electrons tunnel across the insulating oxide layer from the programming electrode and are trapped on the floating gate. Data is erased from the floating gate by placing a sufficient voltage across the floating gate to force the electrons on the floating gate to tunnel across a second oxide layer from the floating gate to an erase electrode.

Virtually all memory devices consist of a plurality of bit memory cells organized in an array of columns and rows. Individual cells are selected by decoder circuitry which generates the appropriate signals to address the proper row and column to access a desired cell or group of cells. The control lines associated with particular rows and columns of the memory are typically referred to as select lines.

In CMOS EEPROM devices, it is desirable to control the voltage on the select lines as closely as possible. Since the memory cells employ a "floating gate" for memory retention, it is essential that known voltages be present on the other portions of the cell so that the magnitude of the charge on the floating gate can be referenced to some known voltage. Therefore, in an EEPROM device, some means are required to regulate or limit the voltage on the memory cell select lines. This problem is complicated by the fact that EEPROM devices present largely capacitive loads and abnormal voltages may be generated due to voltage overshoot during the operation of the device.

This problem has been addressed in prior devices by coupling voltage clamping circuits to the select lines (among others) in EEPROM devices to regulate critical voltages for predictable EEPROM operation. Prior voltage clamping circuits have relied on complicated circuit topologies using comparators and other components which consume a relatively large amount of current. It can be shown that the amount of current required by a voltage clamping circuit is directly related to the number of devices used in the circuit as well as the method used to sense the voltage to be clamped. For example, in one prior voltage clamping technique, a string of series connected diodes, operating above device threshold, is used to clamp the regulated voltage. Thus, this clamping circuit consumes current by maintaining the string of diodes in a forward biased condition. The present invention overcomes high current consumption by providing a voltage sensing circuit with negative feedback which supplies current to the diode string in levels which correspond to sub-threshold operating regions of the voltage clamping diodes, thus providing a substantial reduction in current consumption over prior devices. In addition, the present voltage clamping circuit achieves this result with substantially fewer components than prior clamp circuits, thus providing a substantial reduction in current drain and a substantial improvement in reliability over prior voltage clamping circuits.

Clamping a negative voltge is also useful in CMOS EEPROM devices which require negative reference voltages for accurate cell programming. The present invention provides a voltage clamping circuit wherein a negative reference voltage may be generated without altering the negative power source. Since the generation of a negative voltage typically involves a voltage regulator which consumes current, it is desirable to minimize the current demands on the negative power source. The present invention therefore provides a stable negative reference voltage while requiring an extremely small amount of current from the negative power source. It also enables operation with supply voltages which produce large variations in the negative voltage generated by the on-chip $V_{BB}$ generator.

SUMMARY OF THE INVENTION

Briefly described, the present invention contemplates a method and means to clamp positive and/or negative voltages while minimizing current drain in the voltage clamping circuit. The present invention comprises a voltage clamping circuit including a voltage sensing and clamping means which comprises a chain of series connected diodes disposed between the output of the voltage clamping circuit and a ground reference terminal. As a voltage is developed at said output, current is generated in the series connected diodes which is mirrored in a control circuit means. Current generating means are coupled to said control circuit means and said voltage sensing means for generating a current inversely proportional to said mirrored current and for coupling this generated current to said voltage sensing means. This generated current in the voltage sensing means thereby regulates the voltage at the output terminal at a predetermined level corresponding to the sum of the threshold voltage drops generated across the series connected diodes in the voltage sensing means. The present voltage clamping means consumes only enough current to develop a threshold voltage across each of the diodes in the voltage sensing means.

Accordingly, it is an object of the present invention to provide a voltage clamping circuit which is adapted to clamp either positive or negative voltages.

It is another object of the present invention to substantially reduce current drain in a voltage clamping circuit.

It is still another object of the present invention to provide a voltge clamping circuit which provides improved performance in a voltage clamping circuit with substantially fewer components than prior voltage clamps.

BRIEF DESCRIPTION OF THE DRAWING

The present invention may be fully understood through the description below and the accompanying drawing in which.

DETAILED DESCRIPTION OF THE INVENTION

Figure 1:
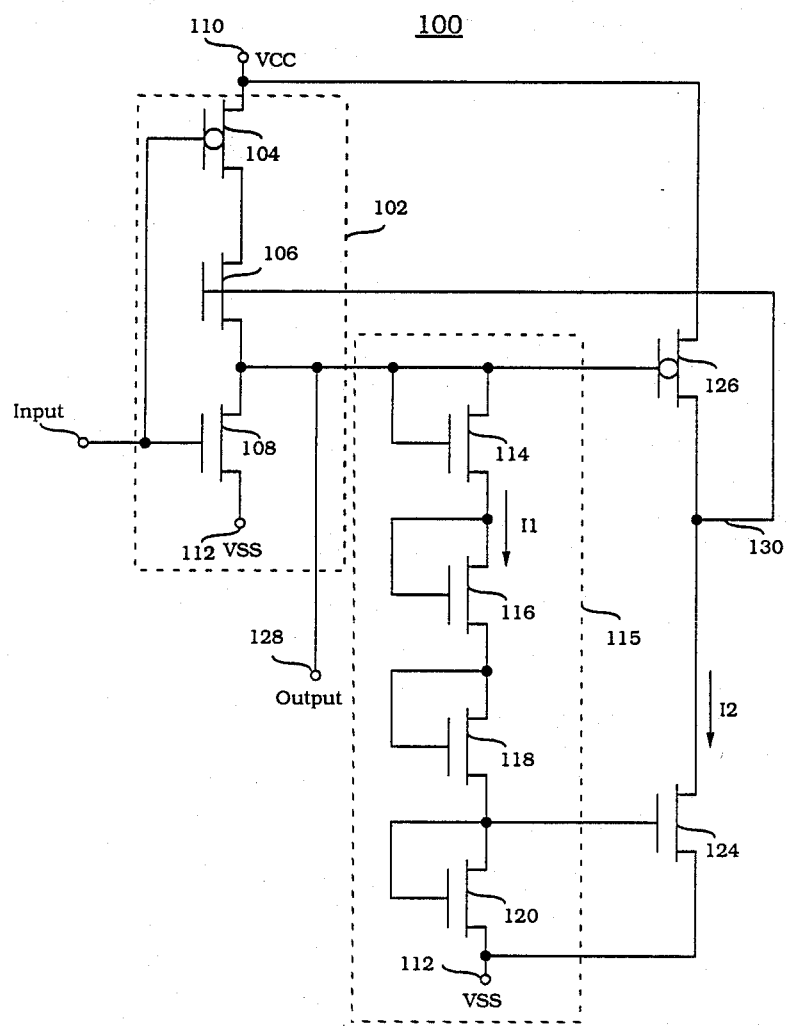
FIG. 1 is a schematic diagram of the preferred embodiment of the present invention.

The present invention provides a voltage clamp circuit having a stable and accurate clamping voltage and yet requires minimal current and circuit area. Referring now to FIG. 1, the preferred embodiment of the present invention is shown in schematic form. As used in the description below, $V_{CC}$ refers to a positive power supply voltage, $V_{SS}$ refers to a ground reference voltage and $V_{BB}$ refers to a negative power supply voltage. The circuit 100 includes a current generating means 102 including series connected transistors 104, 106, and 108. Transistor 104 is a p-type MOS enhancement mode transistor disposed with its source coupled to $V_{CC}$ terminal 110 and its gate coupled in common with the gate of enhancement mode transistor 108. Enhancement mode transistor 106 is disposed in series between transistors 104 and 108 with its source coupled to the drain of transistor 104 and its drain coupled to the source of transistor 108. The drain of transistor 108 is coupled to $V_{SS}$ terminal 112.

A voltage detecting or sensing and clamping means 115 includes a chain of series connected diodes comprising diodes 114, 116, 118 and 120. Specifically, diode 114 comprises an enhancement mode transistor disposed with its gate and source coupled in common wherein this common connection is coupled to the common drain/source connection of transistors 106 and 108. This common connection is also coupled to output terminal 128. Transistor 116 is disposed with its gate and source coupled in common wherein this common connection is coupled to the drain of transistor 106. Transistor 118 is disposed with its gate and source coupled together wherein this common connection is coupled to the drain of transistor 116. Transistor 120 is disposed with its gate and source coupled together wherein this common connection is coupled to the drain of transistor 118. The drain of transistor 120 is coupled to $V_{SS}$ terminal 112. Feedback is provided by transistors 120, 124 and 126. Enhancement mode transistor 124 is disposed with its gate coupled to the common drain/gate-source connection of transistors 118 and 120. Transistor 124 forms a current mirror with respect to transistor 120. The drain of transistor 124 is coupled to $V_{SS}$ terminal 112. Transistor 126 is disposed with its gate coupled to the common gate/source connection of transistor 114. The source of transistor 126 is coupled to $V_{CC}$ terminal 110 and the source of transistor 104. The drain of transistor 126 is coupled to the source of transistor 124. The gate of transistor 106 is coupled to the common drain/source connection of transistors 126 and 124, which is also identified as node 130.

In operation, in an initial state of circuit 100, the input signal coupled to circuit 100 at the gate of transistor 108 is in a "HIGH" state, e.g. it is held at the voltage of $V_{CC}$. In this state, the voltage coupled to the output terminal 128 of circuit 100 is zero volts (the $V_{SS}$ voltage) because transistor 108 is turned "ON" by the input "HIGH" state. Since terminal 128 is coupled to the voltage detecting means 115, there is no voltage drop across diodes 114, 116, 118 and 120, so no current flows in these diodes with zero volts on terminal 128, the gate of transistor 126 is also at zero volts, thereby turning this enhancement transistor "ON", which pulls node 130 to $V_{CC}$ volts and causes transistor 106 to be "ON". Since transistor 104 is held "OFF" by the "HIGH" state of the input signal, no current flows through transistor 106 in this initial state. Thus, the circuit 100 consumes virtually no current in this initial state. As the input signal coupled to the gate of transistor 108 changes from "HIGH to "LOW", circuit 100 functions to cause output node 128 to be clamped to a predetermined voltage. As the gate of transistor 108 is driven low to zero volts, transistor 108 is driven out of conduction. Transistor 104 turns "ON", and since transistor 106 is already "ON", the voltage on output node 128 rises toward $V_{CC}$. In the embodiment shown, when the voltage at node 128 reaches four diode voltage drops above $V_{SS}$, current I1 will begin to flow in the series diode chain 115. Current I1 is mirrored by transistors 120 and 124 which acts as a control circuit means with transistor 126 for generating a corresponding current I2. Since the voltage at the gate of transistor 126 is rising, transistor 126 begins to turn "OFF" and node 130 is pulled toward $V_{SS}$. Since node 130 is fed back to the gate of transistor 106, this voltage forces transistor 106 out of conduction, thus limiting the current coupled through transistor 106 to the series diode chain 115. Thus, through negative feedback, the current passing through transistors 104 and 106 is only the current I1 in the diode chain 115 required for I1 to mirror in transistor 124 sufficient current I2 to maintain the gain of transistor 106 at a point where a desired clamping voltage is developed across the series connected diode chain 115. In the preferred practice of the present invention, with the input signal "LOW" the series connected diode chain operates in a threshold region wherein an extremely small amount of current is required. The clamping voltage level produced by circuit 100 is controlled by the number of diodes in the series diode chain 115. That is, increasing the number of diodes increases the clamping voltage of the circuit 100. Varying the gain of the feedback transistors also can be used to control the clamping level.

As previously mentioned, when the Input signal coupled to the circuit 100 is high, the circuit 100 is completely disabled and consumes zero current. When the Input signal coupled to the circuit 100 is low (the clamping mode) current I1 is typically in the range of 1-microamperes and I2 is typically in the range of 3-microamperes, depending on the gain of transistors 124 and 126. In the preferred practice of the present invention it is desirable for transistor 126 to have relatively low gain. In addition, the gate voltages of transistors 124 and 126 are separated by the voltage generated by the diode chain 115 less one threshold voltage. This enables better current control by transistors 124 and 126 and minimizes the resultant current I1, generated in the steady state clamping condition.

Note also that p-channel transistors may also be used to form diode chain 115, although diode 120 would still need to be n-type. Various modifications to the cicuit would be necessary as would be apparent to those skilled in the art if p-channel devices are used.

Figure 2:
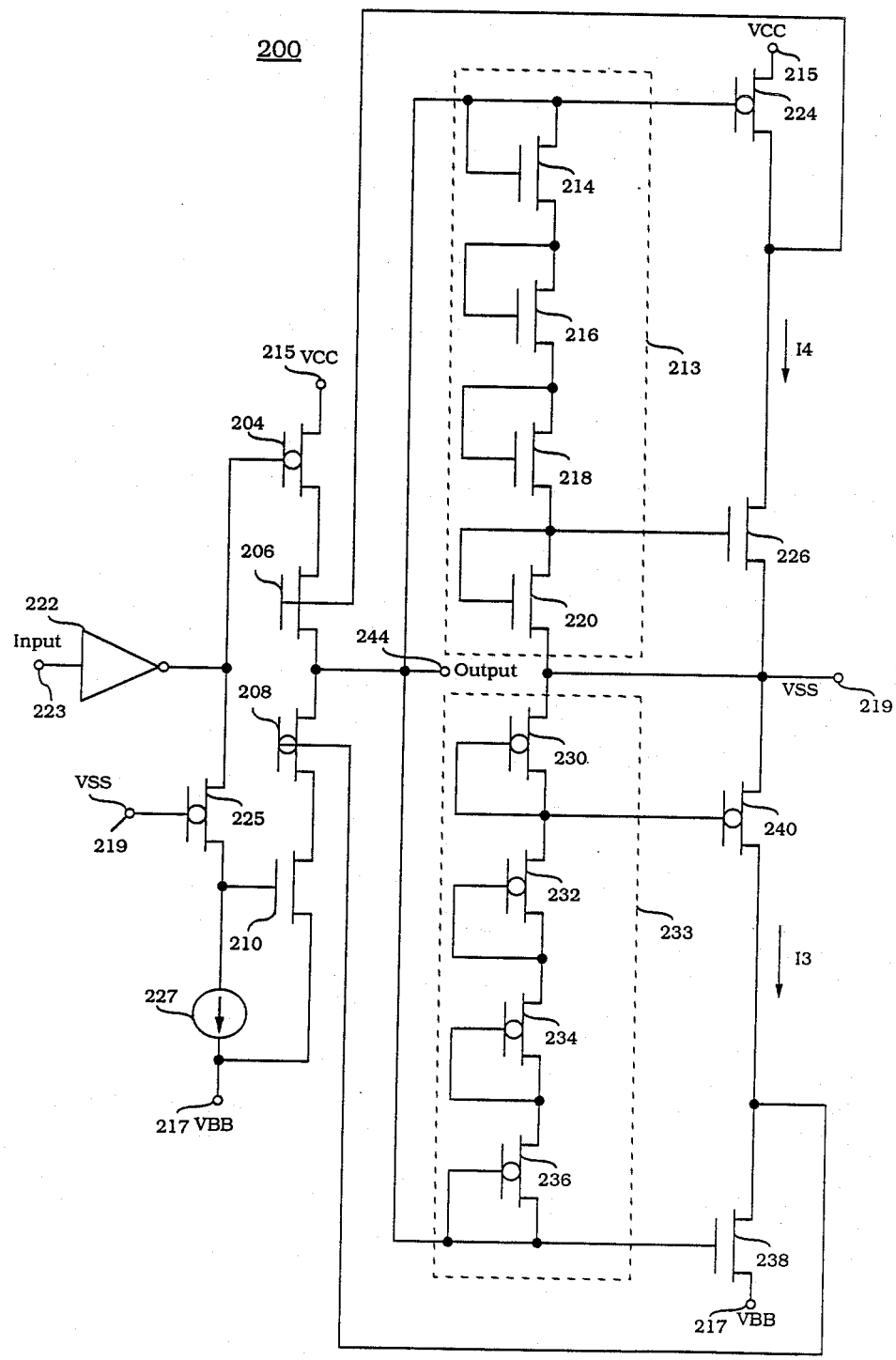
FIG. 2 is a schematic diagram of a second embodiment of the present invention adapted for clamping positive and negative voltages.

Referring now to FIG. 2, the circuit 200 includes means for clamping positive and/or negative voltages and provides the same current saving advantages as the circuit 100. The Input signal coupled to the circuit 200 is first fed through an inverter 222 to the gate of a p-channel enhancement mode transistor 204. The source of transistor 204 is coupled to VCC terminal 215 and the drain of transistor 204 is coupled to the source of an n-channel enhancement mode transistor 206. The drain of transistor 206 is connected to the source of enhancement mode transistor 208 and this node is also defined as the circuit 200 Output node or terminal 244. The drain of transistor 208 is connected to the source of enhancement mode transistor 210. The drain of transistor 210 is coupled to $V_{BB}$ terminal 217. The output of inverter 222 is also coupled the source of a p-channel enhancement transistor 225. The gate of transistor 225 is coupled to $V_{SS}$ terminal 219 and the drain of transistor 225 is coupled to the gate of transistor 210. A current source 227, is disposed between the gate of transistor 210 and VBB terminal 215.

The positive clamping portion of the circuit 200 includes series connected diode chain 213 comprising enhancement mode transistors 214, 216, 218 and 220. Specifically, the gate and source of transistor 214 are coupled together and the drain of transistor 214 is coupled to the gate and source of transistor 216. The drain of transistor 216 is coupled to the gate and source of transistor 218. The drain of transistor 218 is coupled to the gate and source of transistor 220. The drain of transistor 220 is coupled to $V_{SS}$ terminal 219. A p-type enhancement mode transistor 224 is disposed with its source coupled to $V_{CC}$ terminal 215 and its gate coupled to the source drain connection of transistor 214. An n-channel enhancement mode transistor 226 is disposed with its gate coupled to the gate/source connection of transistor 220, its source coupled to the drain of transistor 224 and its drain coupled to $V_{SS}$ terminal 219.

The negative clamping portion of the circuit 200 includes series connected diode chain 233 comprising p-type enhancement node transistors 230, 232, 234 and 236. Specifically, the gate and drain of transistor 230 are coupled together and the drain of transistor 230 is coupled to the source of transistor 232. The source of transistor 230 is coupled to VSS terminal 219. The gate and drain of transistor 232 are coupled to the source of transistor 234. The gate and drain of transistor 234 are coupled to the source of transistor 236. The gate and drain of transistor 236 are coupled together. An enhancement mode transistor 240 is disposed with its source coupled to VSS terminal 219 and its gate coupled to the gate/drain connection of transistor 230. A depletion mode transistor 238 is disposed with its gate coupled to the gate/drain connection of transistor 236, its source coupled to the drain of transistor 240 and its drain coupled to $V_{BB}$ terminal 217. The gates of transistors 224 and 238 are also coupled to output node 244. The gate of transistor 206 is coupled to the common drain/source connection of transistors 224 and 226. The gate of transistor 208 is coupled to the common drain/source connection of transistors 238 and 240.

In operation, the negative clamping portion of the circuit 200 is referenced to $V_{BB}$ and the positive clamping portion is referenced to $V_{CC}$. As the input to inverter 222 goes low, its output is driven high thus turning "OFF" transistor 204 and turning "ON" transistors 225 and 210. This pulls output terminal 244 towards $V_{BB}$ until the series connected diode chain 233 begins to conduct current. Current flow in the series connected diode chain is mirrored by transistors 236 and 238 which generate current I3 which flows through transistor 240. As transistor 240 begins to conduct current, output node 244 is driven back toward $V_{SS}$ which begins to turn transistor 208 "OFF", thereby limiting current at output node 244. Transistor 225 is an isolation device gated by $V_{SS}$ which allows the gate of transistor 210 to switch to $V_{BB}$ thus disabling it whenever the input to the circuit 200 is high and the output of the circuit 200 is clamped at its negative level.

The operation of the positive clamping portion of the circuit 200 is identical to the operation of the circuit 100. As the input of inverter 222 goes high, its output goes "LOW", transistor 204 turns "ON" and the voltage at output node 244 rises toward $V_{CC}$. In the embodiment shown, when the voltage at output terminal 244 rises to four diode drops above $V_{SS}$, current begins to flow in the series diode chain 213. This current is mirrored by transistors 220 and 226 which generate current I4 into transistor 224 which controls the gate of transistor 206. Since the voltage at the gate of transistor 226 is rising, transistor 226 begins to turn off and the gate of transistor 206 is pulled toward $V_{SS}$. This forces transistor 206 out of conduction and limits the current delivered to the series connected diode chain 213 thus clamping the voltage at terminal 244 at a predetermined level corresponding to the sum of threshold voltages of the series connected diodes.

Figure 3:
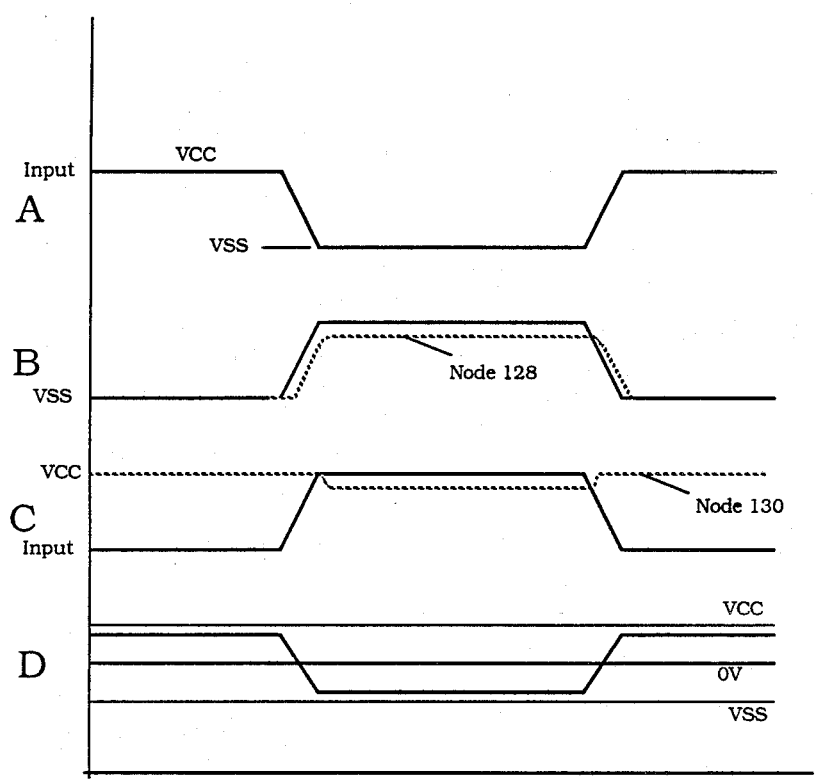
FIG. 3 is a timing diagram which exemplifies the operation of the circuits of FIGS. 1 and 2.

Referring now to FIG. 3, there is a series of graphs depicting the operation of the circuit 100. The input to the circuit 100 is a signal which, as shown in graph A, switches between 0 volts and $V_{CC}$. When the input signal to transistor 108 switches from high to low, the voltage at output node 128 is clamped to 4 diode threshold voltages above $V_{SS}$ as shown in graph B. When the circuit 100 is in regulation, the voltage at node 130 settles at approximately $V_{CC}$ minus a diode threshold voltage drop, as shown in graph C. Node 130 switches to $V_{CC}$ whenever the output of the circuit 100 is at $V_{SS}$. Graph D shows the output of the circuit 200 as the input to the circuit switches between zero volts and $V_{CC}$ as shown in graph 'A' and the circuit 200 Output is switched between a positive voltage relative to $V_{CC}$ and a negative voltage relative to $V_{BB}$.

Accordingly, an improved voltage clamping circuit has been described. The present invention includes a current generating means which is responsive to a control circuit. The control circuit controls the output current of the current generaing means so that only enough current is generated to maintain a desired voltage at the output of the voltge clamping circuit. Accordingly, other uses and modifications will be apparent to a person of ordinary skill in the art without departing from the scope of the present invention.

What is claimed is:

1. An improved voltage clamping circuit for clamping a voltage at a predetermined voltage, said voltage clamping circuit having a power source terminal having a supply voltage coupled thereto, an output terminal and a reference terminal, comprising:
   voltage sensing and clamping means coupled between said output terminal of said voltage clamping circuit and said reference terminal for controlling the voltage appearing between said output terminal and said reference terminal, including means for developing and sensing said voltage and for clamping said voltage at a predetermined voltage;

control circuit means coupled to said voltage sensing and clamping means for generating a control signal related to said voltage; and current generating means coupled to said control circuit means and connected between said power source terminal and said voltage sensing and clamping means for generating a current responsive to said control signal, said generated current being of sufficient magnitude to produce said voltage across said voltage sensing and clamping means.

2. The apparatus of claim 1 further including input means for disabling said current generating means in response to an input signal.

3. The apparatus of claim 1 wherein said reference terminal is coupled to a ground reference potential.

4. The apparatus of claim 1 wherein said voltage clamp circuit supply voltage is a positive voltage.

5. The apparatus of claim 1 wherein said voltage clamp circuit supply voltage is a negative voltage.

6. The apparatus of claim 1 wherein said voltage sensing and clamping means comprises a first diode having first and second terminals wherein said first terminal of said first diode is coupled to said output terminal of said voltage clamping means, a second diode having first and second terminals wherein said second terminal of said second diode is coupled to said reference terminal, and at least one series connected diode coupled between said second and first terminals of said first and second diodes, respectively.

7. The apparatus of claim 6 wherein each respective diode comprises an n-type enhancement mode transistor having a source, a drain, and a gate, and wherein said said first terminal comprises the source and gate of said transistor connected in common and said second terminal comprises the drain of said transistor.

8. The apparatus of claim 6 wherein each respective diode comprises a p-type enhancement mode transistor having a source, a drain, and a gate, and wherein said said first terminal comprises the drain and gate of said transistor connected in common and said second terminal comprises the source of said transistor.

9. The apparatus of claim 6 wherein said control circuit means comprises a p-type enhancement mode transistor having a gate, source and drain said p-type enhancement mode transistor disposed with its source coupled to said power source terminal, and its gate coupled to said output terminal of said voltage clamping means and an n-type enhancement mode transistor having a gate, source and drain said n-type enhancement mode transistor disposed with its source coupled to the drain of said p-type enhancement mode transistor, its drain coupled to said reference terminal and its gate coupled to said first terminal of said second diode.

10. The apparatus of claim 9 wherein said current generating means comprises a p-type enhancement mode transistor having a gate, source and gain said p-type enhancement mode transistor disposed with its gate coupled to said power source terminal, its source coupled to said power source terminal, and further comprising an n-type enhancement mode transistor having a gate, source and drain said n-type enhancement mode transistor disposed with its drain coupled to said output terminal of said voltage clamping means, its source coupled to the drain of said p-type enhancement mode transistor and its gate coupled to the source of said n-type enhancement mode transistor of said control circuit means.

11. The apparatus of claim 9 further including an input terminal, and wherein said current generating means comprises a p-type enhancement mode transistor having a gate, source and drain said p-type enhancement mode transistor disposed with its source coupled to said power source terminal and further comprising a first n-type enhancement mode transistor having gate, source and drain said n-type enhancement mode transistor disposed with its drain coupled to said output terminal of said voltage clamping means, its source coupled to the drain of said p-type enhancement mode transistor and its gate coupled to the source of said n-type enhancement mode transistor of said control circuit means and a second n-type enhancement mode transistor having a gate, source and drain said n-type enhancement mode transistor disposed with its drain coupled to said reference terminal of said voltage clamping means, its source coupled to the drain of said first n-type enhancement mode transistor and its gate coupled to the gate of said p-type enhancement mode transistor wherein this common gate connection comprises said input terminal of said voltage clamping means.

12. The apparatus of claim 1 wherein said current generating means comprises a transistor of a first conductivity type having a gate, source and drain said transistor of a first conductivity type disposed with its gate coupled to said power source terminal, its source coupled to said power source terminal and further comprising a transistor of a second conductivity type having a gate, source and drain said second transistor of a second conductivity type disposed with its drain coupled to said output terminal of said voltage clamping means, its source coupled to the drain of said transistor of said first conductivity type and its gate coupled to said control circuit means.

13. The apparatus of claim 12 wherein said transistor of a first conductivity type is a p-type enhancement mode transistor.

14. The apparatus of claim 12 wherein said transistor of a second conductivity type is a n-type enhancement mode transistor.

15. The apparatus of claim 1 further including an input terminal, and wherein said current generating means comprises a transistor of a first conductivity type having a gate, source and drain said transistor of a first conductivity type disposed with its source coupled to said power source terminal and further comprising a first transistor of a second conductivity type having gate, source and drain said first transistor of a second conductivity type disposed with its drain coupled to said output terminal of said voltage clamping means, its source coupled to the drain of said transistor of a first conductivity type and its gate coupled to said control circuit means and a second transistor of a second conductivity type having gate, source and drain said second transistor of a second conductivity type disposed with its drain coupled to said reference terminal of said voltage clamping means, its source coupled to the drain of said transistor of a first conductivity type and its gate coupled to the gate of said transistor of said first conductivity type wherein this common gate connection comprises said input terminal of said voltage clamping means.

16. The apparatus of claim 15 wherein said transistor of a first conductivity type is a p-type enhancement mode transistor.

17. The apparatus of claim 15 wherein said transistor of a second conductivity type is a n-type enhancement mode transistor.

18. The apparatus of claim 2 wherein said disabling means includes means for coupling said output terminal to said reference terminal and means for decoupling said power source terminal from said current generating means.

19. An improved current controlled voltage reference having a power source terminal having a supply voltage coupled thereto, an output terminal and a reference terminal, comprising:
  voltage sensing and clamping means coupled between said output terminal of said voltage sensing and clamping circuit and said reference terminal for controlling the voltage appearing between said output terminal and said reference terminal, including means for developing and sensing said voltage and for clamping said voltage at a predetermined voltage;
  control circuit means coupled to said voltage sensing and clamping means for generating a control signal related to said voltage; and
  current generating means coupled to said control circuit means and connected between said power source terminal and said voltage sensing and clamping means for generating a current responsive to said control signal, said generated current being of sufficient magnitude to produce said voltage across said voltage sensing and clamping means.

20. An improved voltage clamping circuit for clamping positive and negative voltages at predetermined voltages, said voltage clamping circuit including a positive power source terminal having a positie supply voltage coupled thereto, a negative power source terminal having a negative supply voltage coupled thereto, an output terminal and a reference terminal, comprising:
  positive and negative voltage sensing and clamping means coupled between said output terminal of said voltage clamping circuit and said reference terminal for for controlling the voltage appearing between said output terminal and said reference terminal, including means for developing and sensing a selected one of said positive and negative voltages and for clamping said selected voltage at a predetermined voltage;
  first and second control circuit means coupled to said positive and negative voltage sensing and clamping means for generating first and second control signals respectively said first control signal related to said positive voltage and said second control signal related to said negative voltage;
  first and second current generating means coupled to said first and second control circuit means respectively for generating first and second control currents in inverse proportion to said first and second control signals, respectively, said first current generating means coupled between said positive power source terminal and said positive voltage sensing and clamping means, said second current generating means coupled between said negative power source terminal and said negative voltage sensing and clamping means, said generated currents each being of sufficient magnitude to produce said selected positive or negative voltage across said positive and negative voltage sensing and clamping means; and
  means for disabling a selected one of said first and second current generating means.

21. The apparatus of claim 20 further including input means for disabling said selected one of said first and second current generating means in response to an input signal.

22. The apparatus of claim 20 wherein said reference terminal is coupled to a ground reference potential.

23. The apparatus of claim 1 wherein said positive voltage sensing and clamping means comprises a first diode having first and second terminals wherein said first terminal of said first diode is coupled to said output terminal of said voltage clamping means, a second diode having first and second terminals wherein said second terminal of said second diode is coupled to said reference terminal and at least one series connected diode coupled between said second and first terminals of said first and second diodes, respectively.

24. The apparatus of claim 23 wherein each respective diode comprises an n-type enhancement mode transistor having a source, a drain, and a gate, and wherein said said first terminal comprises the source and gate of said transistor connected in common and said second terminal comprises the drain of said transistor.

25. The apparatus of claim 20 wherein said negative voltage sensing and clamping means comprises a first diode having first and second terminals wherein said first terminal of said first diode is coupled to said output terminal of said voltage clamping means, a second diode having first and second terminals wherein said second terminal of said second diode is coupled to said reference terminal and at least one series connected diode coupled between said second and first terminals of said first and second diodes, respectively.

26. The apparatus of claim 23 wherein each respective diode comprises a p-type enhancement mode transistor having a source, a drain, and a gate, and wherein said said first terminal comprises the drain and gate of said transistor connected in common and said second terminal comprises the source of said transistor.

27. The apparatus of claim 23 wherein said first control circuit means comprises a p-type enhancement mode transistor having a gate, source and drain said p-type enhancement mode transistor disposed with its source coupled to said positive power source terminal, and its gate coupled to said output terminal of said voltage clamping means and an n-type enhancement mode transistor having a gate, source and drain said n-type enhancement mode transistor disposed with its source coupled to the drain of said p-type enhancement mode transistor, its drain coupled to said reference terminal and its gate coupled to said first terminal of said second diode.

28. The apparatus of claim 25 wherein said second control circuit means comprises an n-type enhancement mode transistor having a gate, source and drain said n-type enhancement mode transistor disposed with its drain coupled to said negative power source terminal, and its gate coupled to said output terminal of said voltage clamping means and a p-type enhancement mode transistor having a gate, source and drain said p-type enhancement mode transistor disposed with its drain coupled to the source of said n-type enhancement mode transistor, its source coupled to said reference terminal and its gate coupled to said first terminal of said second diode.

29. The apparatus of claim 27 wherein said first current generating means comprises a p-type enhancement mode transistor having a gate, source and drain said p-type enhancement mode transistor disposed with its source coupled to said positive power source terminal and its gate coupled to a first control terminal, and further comprising an n-type enhancement mode transistor having a gate, source and drain said n-type enhancement mode transistor disposed with its drain coupled to said output terminal of said voltage clamping means, its source coupled to the drain of said p-type enhancement mode transistor and its gate coupled to source of said n-type enhancement mode transistor of said first control circuit means.

30. The apparatus of claim 28 wherein said second current generating means comprises a n-type enhancement mode transistor having a gate, source and drain said n-type enhancement mode transistor disposed with its drain coupled to said negative power source terminal, and its gate coupled to a second control terminal, and further comprising a p-type enhancement mode transistor having gate, source and drain said p-type enhancement mode transistor disposed with its source coupled to output terminal of said voltage clamping means its drain coupled to the source of said n-type enhancement mode transistor, and its gate coupled to the source of said n-type enhancement mode transistor of said second control circuit means.

31. The apparatus of claim 29 wherein said first control terminal of said first current generating means is coupled to said positive power source terminal.

32. The apparatus of claim 30 wherein said first control terminal of said second current generating means is coupled to said negative power source terminal.

33. The apparatus of claim 21 wherein said input means comprises:
   an input terminal for receiving a input signal;
   an inverter having an input and an output, wherein the input to said inverter is coupled to said input terminal and the output of said inverter is coupled to said first current generating means; and
   an n-type enhancement transistor means having a gate source and drain wherein said gate is coupled to said negative power source terminal, its source is coupled to said output of said inverter and its drain is coupled to said second current generating means.

* * * * *